United States Patent
Matsumoto et al.

(10) Patent No.: US 7,473,981 B2
(45) Date of Patent: Jan. 6, 2009

(54) ELECTRONIC COMPONENT

(75) Inventors: Tsuyoshi Matsumoto, Kawasaki (JP); Yoshihiro Mizuno, Kawasaki (JP); Xiaoyu Mi, Kawasaki (JP); Hisao Okuda, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/582,506

(22) Filed: Oct. 18, 2006

(65) Prior Publication Data
US 2007/0102784 A1 May 10, 2007

(30) Foreign Application Priority Data
Nov. 8, 2005 (JP) ............... 2005-323335

(51) Int. Cl.
*H01L 21/00* (2006.01)
(52) U.S. Cl. .............. 257/532; 257/528; 257/535
(58) Field of Classification Search .......... 257/528, 257/532, 307, 535
See application file for complete search history.

(56) References Cited

U.S. PATENT DOCUMENTS

| | | | |
|---|---|---|---|
| 6,552,384 B2 * | 4/2003 | Murata et al. | 257/307 |
| 6,777,736 B2 * | 8/2004 | Saigoh et al. | 257/300 |
| 7,161,793 B2 * | 1/2007 | Kurihara et al. | 361/306.3 |
| 7,227,736 B2 * | 6/2007 | Shioga et al. | 361/306.1 |
| 2004/0080021 A1 * | 4/2004 | Casper et al. | 257/528 |
| 2004/0124497 A1 * | 7/2004 | Rottenberg et al. | 257/532 |
| 2005/0093095 A1 * | 5/2005 | Yamagata | 257/532 |
| 2007/0102784 A1 * | 5/2007 | Matsumoto et al. | 257/528 |

FOREIGN PATENT DOCUMENTS

| | | |
|---|---|---|
| JP | 4-61264 | 2/1992 |
| JP | 2002-33239 | 1/2002 |
| JP | 2003-17366 | 1/2003 |

* cited by examiner

*Primary Examiner*—Laura M Menz
(74) *Attorney, Agent, or Firm*—Kratz, Quintos & Hanson, LLP

(57) ABSTRACT

An electronic component includes a substrate, a capacitor, and a wiring. The capacitor has a multilayer structure including a first electrode film provided on the substrate, a second electrode film of 2 to 4 μm in thickness disposed to face the first electrode film, and a dielectric film interposed between the first and the second electrode film. The wiring includes a joint portion connected to the second electrode film, on the opposite side of the dielectric film.

6 Claims, 7 Drawing Sheets

ELECTRONIC COMPONENT

BACKGROUND OF THE INVENTION

1. Field of the Invention:

The present invention relates to an electronic component that includes a capacitor provided on a substrate, for example formed by semiconductor processing technology.

2. Description of the Related Art:

In a radio frequency (RF) system such as a mobile phone or a wireless LAN, signals are subjected to phase-matching for satisfactory transmission among functional devices constituting the system. Accordingly, the input/output (I/O) terminal of each device is provided with a passive element that includes a passive component such as an inductor or a capacitor, and that acts as a phase shifter for controlling the phase of the signals.

In the RF system, a SAW filter is employed for use as a narrow-band frequency filter. The SAW filter, which includes a piezoelectric element, produces a difference in potential between piezoelectric element electrodes because of a piezoelectric effect, when a physical impact or a thermal effect is applied to the SAW filter or the piezoelectric element thereof during the manufacturing process of the apparatus in which the SAW filter is incorporated. In this case, a predetermined voltage is applied to an electronic component electrically connected to the SAW filter. The capacitor included in the passive element (phase shifter) is usually electrically connected to the SAW filter, and hence the capacitor has to have a high withstanding voltage (e.g. 150 V or higher), to prevent a dielectric breakdown between the capacitor electrodes, which may occur upon application of a voltage accidentally generated by the SAW filter or the piezoelectric element thereof.

There has been a constant demand for reduction in dimensions of various parts composing RF systems, driven by the increase in number of parts for achieving a higher performance. For making the system smaller in dimensions, an integrated passive device (hereinafter, IPD) manufactured based on a semiconductor processing technology, which includes a plurality of predetermined passive components such as an inductor, a capacitor, a resistor and a filter densely integrated therein, may be employed the passive element (phase shifter). When employing the IPD, the capacitor included therein still has to have a high withstanding voltage, for preventing a dielectric breakdown between the capacitor electrodes, as stated above. Techniques related to the IPD are found, for example, in JP-A-H04-61264 and JP-A-2002-33239.

FIG. 9 is a schematic cross-sectional view showing a part of a conventional IPD 90. The IPD 90 includes a substrate 91, a plurality of passive components each including a capacitor 92, integrated on the substrate 91, an wiring 93 and a protecting film 94. The capacitor 92 has a multilayer structure including an electrode film 92a (lower electrode film), an electrode film 92b (upper electrode film), and a dielectric film 92c. The wiring 93 includes a joint portion 93a connected to the electrode film 92b.

The electrode film 92b has a thickness of approximately 1 μm. For forming the electrode film 92b, a conductor film, which is to subsequently serve as the electrode film 92b, is formed on the substrate 91 to cover the electrode film 92a and the dielectric film 92c already formed on the substrate 91. A resist film given a pattern corresponding to the electrode film 92b is then provided on the conductor film, and an ion milling process is performed utilizing the resist film as the mask, thus to shape the conductor film according to the pattern. When performing such subtractive process to form the electrode film 92b, the thinner the conductor film, or the electrode film 92b is, the more accurately the electrode film 92b can be formed in pattern (hence in area). The precision in area of the electrode film 92b affects the precision in static capacitance of the capacitor 92, which is why the electrode film 92b is formed in a thickness of approximately 1 μm in the conventional IPD 90, for achieving high precision in static capacitance.

In contrast, the wiring 93 (including the joint portion 93a) is formed in a relatively greater thickness. Making the wiring 93 thicker can reduce a resistance thereof, and the reduction in resistance is preferable from the viewpoint of reducing a signal loss through the IPD 90. Accordingly, the wiring 93 is formed in a thickness of approximately 10 μm for example.

The capacitor 92 of the conventional IPD 90, however, often has a withstanding voltage below a practically acceptable level, which has to be addressed. For improving the withstanding voltage of the capacitor 92, it could be an option to form the dielectric film 92c in a greater thickness. Increasing the thickness of the dielectric film 92c, however, requires increasing the area of the electrode film 92b, because otherwise the static capacitance of the capacitor 92 cannot be maintained. Therefore, it is not preferable to increase the thickness of the dielectric film 92c, from the viewpoint of suppressing an increase in dimensions of the capacitor 92, hence the IPD 90.

SUMMARY OF THE INVENTION

The present invention has been proposed in the above-described situation. It is an object of the present invention to provide an electronic component including a capacitor that facilitates achieving a high withstanding voltage.

The present invention provides an electronic component comprising a substrate, a capacitor, and a wiring. The capacitor has a multilayer structure including a first electrode film (lower electrode film) provided on the substrate, a second electrode film (upper electrode film) having a thickness of 2 to 4 μm and disposed to face the first electrode film, and a dielectric film interposed between the first and the second electrode film. The wiring includes a joint portion connected to the second electrode film on the opposite side of the dielectric film. The electronic component according to the present invention encompasses a single capacitor element as well as an integrated electronic component in which a capacitor element and other elements are combined.

According to studies pursued by the present inventors, it has been discovered that, in the capacitor 92 of the conventional IPD 90, the dielectric film 92c is prone to incur collapse of the film structure at a portion corresponding to a periphery of the joint portion 93a of the wiring 93, once a dielectric breakdown takes place. Stress strain concentrates on a periphery of the joint portion 93a, which is relatively thick, and the stress strain is considered to propagate to the dielectric film 92c via the electrode film 92b which is as thin as approximately 1 μm, in the capacitor 92 before emergence of the dielectric breakdown, thereby producing more flaws in the film structure in the portion of the dielectric film 92c corresponding to the periphery of the joint portion 93a, than in the remaining portions thereof. This is considered to be a reason why the dielectric film 92c is prone to incur collapse of the film structure in the portion corresponding to the periphery of the joint portion 93a, in the capacitor 92.

The inventors have also found that employing an upper electrode film of 10 μm in thickness in place of the electrode film 92b provokes the collapse of the film structure, upon applying an excessive voltage, in a portion of the dielectric film 92c corresponding to the periphery of the upper electrode film, rather than the portion thereof corresponding to the periphery of the joint portion 93a. Since stress strain concentrates on the periphery of the upper electrode film itself, which is relatively thick, the stress strain is considered to propagate to the dielectric film 92c before the emergence of the dielectric breakdown, thereby producing more flaws in the film structure in the portion of the dielectric film 92c corresponding to the periphery of the upper electrode film, than in the remaining portions thereof. This is considered to be a reason that the dielectric film 92c is prone to incur the collapse of the film structure in the portion corresponding to the periphery of the upper electrode film.

Based on the foregoing findings, the present inventors have discovered that the thickness of the upper electrode film affects the withstanding voltage of a capacitor element fabricated by, for example, a semiconductor processing technology, thereby accomplishing the present invention.

In the electronic component according to the present invention, the second electrode film (upper electrode film), interposed between the dielectric film of the capacitor and the joint portion of the wiring, is formed in a thickness of 2 μm or greater. The present inventors have discovered that the second electrode film of 2 μm or more in thickness can significantly suppress propagation of stress strain concentrating in the periphery of the joint portion of the wiring to the dielectric film, even when the joint portion is formed to be relatively thick (for example, 10 μm or more), thereby preventing emergence of a flaw in the film structure of the dielectric film originating from the propagation of the stress strain in the joint portion to the dielectric film. Also, in the electronic component according to the present invention, the second electrode film is formed in a thickness of 4 μm or less. This is because the present inventors have discovered that the second electrode film of 4 μm or less in thickness does not incur therein unduly great stress strain, and hence barely provokes emergence of a flaw due to the stress strain, in the film structure of the dielectric film. The electronic component according to the present invention is provided based on these findings, and includes the capacitor that facilitates suppressing emergence of a flaw in the film structure of the dielectric film, and thus achieving a high withstanding voltage.

According to the present invention, preferably the joint portion of the wiring may-be thicker than the second electrode film, and more preferably 10 μm or more in thickness. This is because forming the joint portion in a greater thickness can reduce the resistance of the joint portion and the wiring.

Preferably, the dielectric film of the capacitor may have a thickness of 1 μm or less. The thinner the dielectric film is, the larger static capacitance can be obtained in the capacitor.

It is preferable that the second electrode film is formed by a plating process. The plating process is appropriate for efficiently forming the second electrode film in a thickness of 2 to 4 μm.

Preferably, the electronic component according to the present invention may further include a passive component provided on the substrate, and the wiring electrically may connect the passive component and the second electrode film of the capacitor. Under or in place of such structure, the electronic component according to the present invention may further include an electrode pad provided on the substrate, and the wiring electrically may connect the electrode pad and the second electrode film of the capacitor. The electronic component according to the present invention may be an integrated electronic component having such structure.

DETAILED DESCRIPTION OF THE PREFERRED EMBODIMENT

Figure 1:
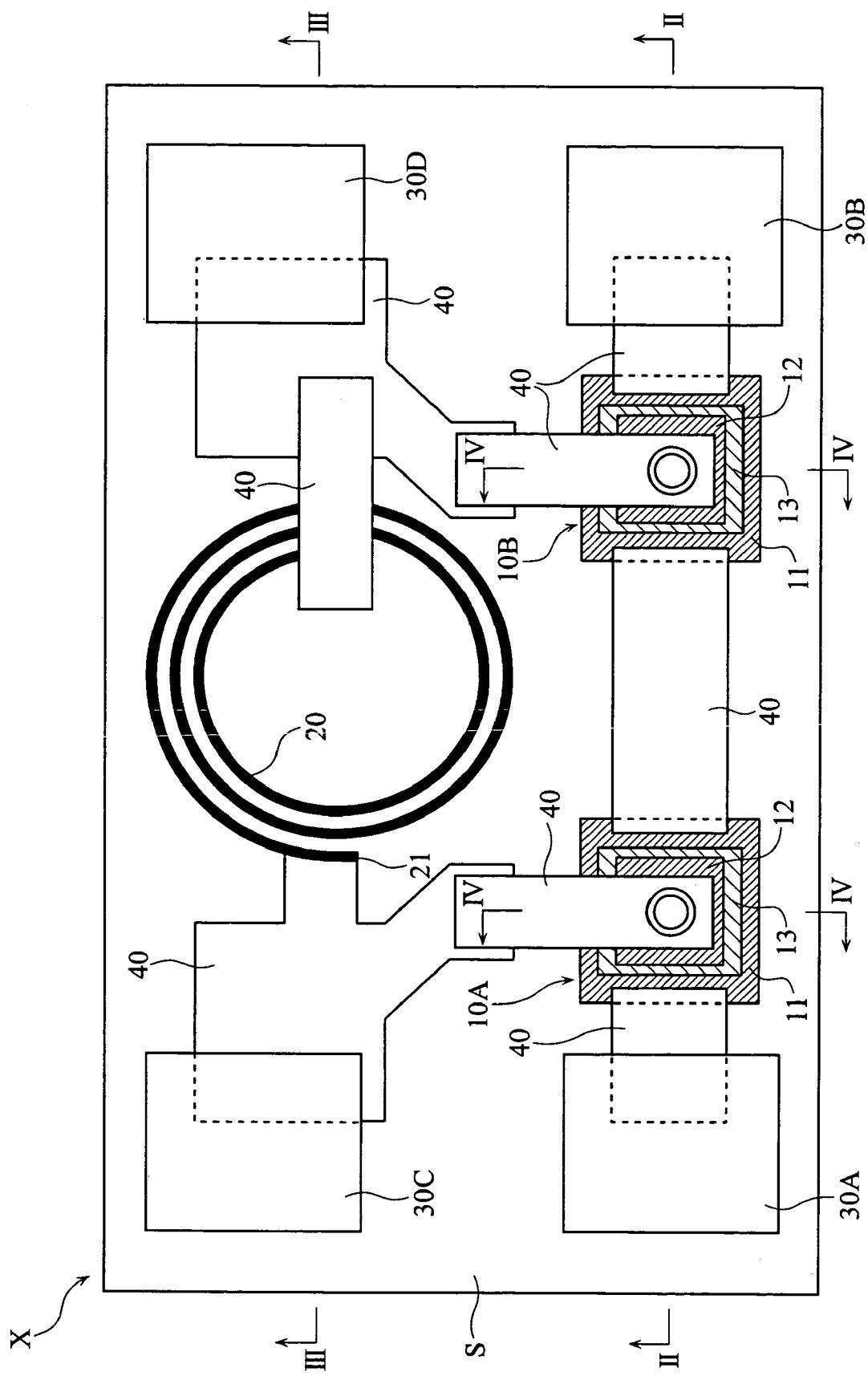
FIG. 1 is a plan view showing an integrated electronic component according to the present invention.
Figure 2:
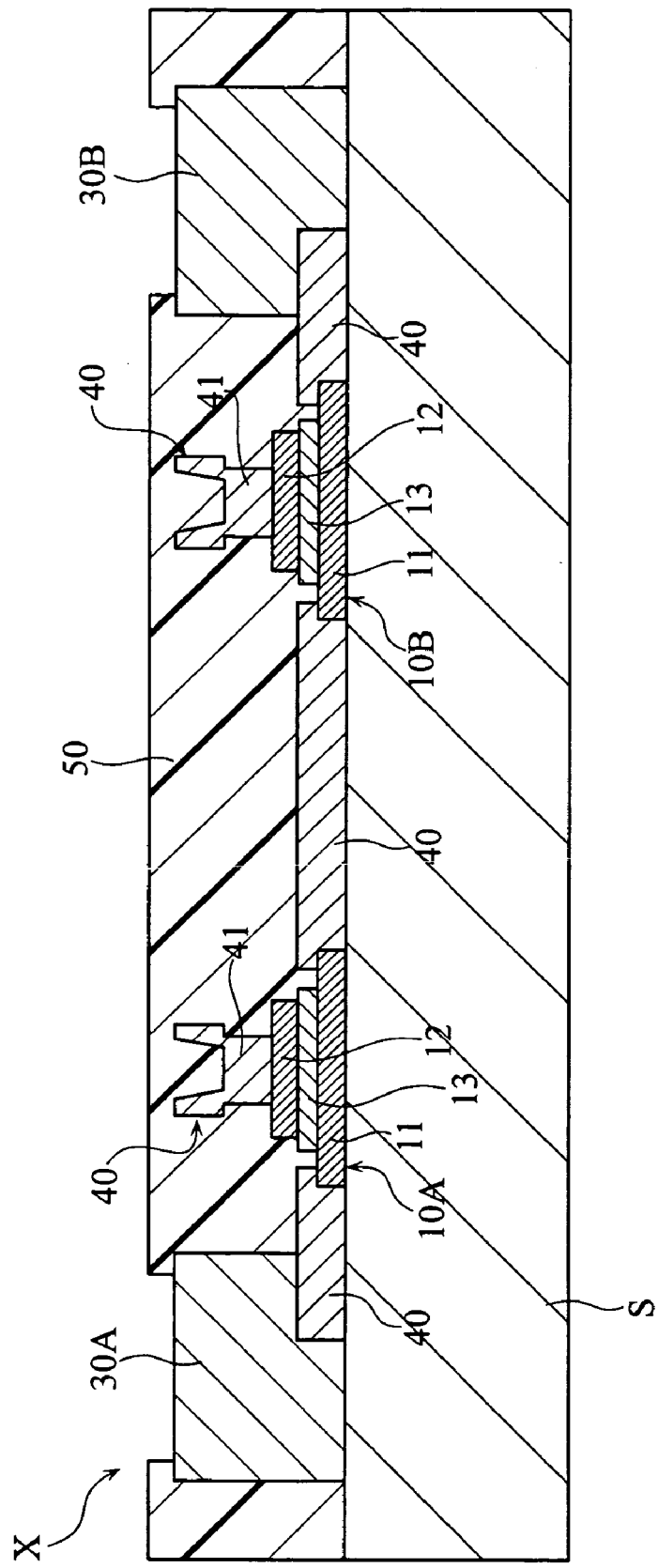
FIG. 2 is a cross-sectional view taken along the line II-II of FIG. 1.
Figure 3:
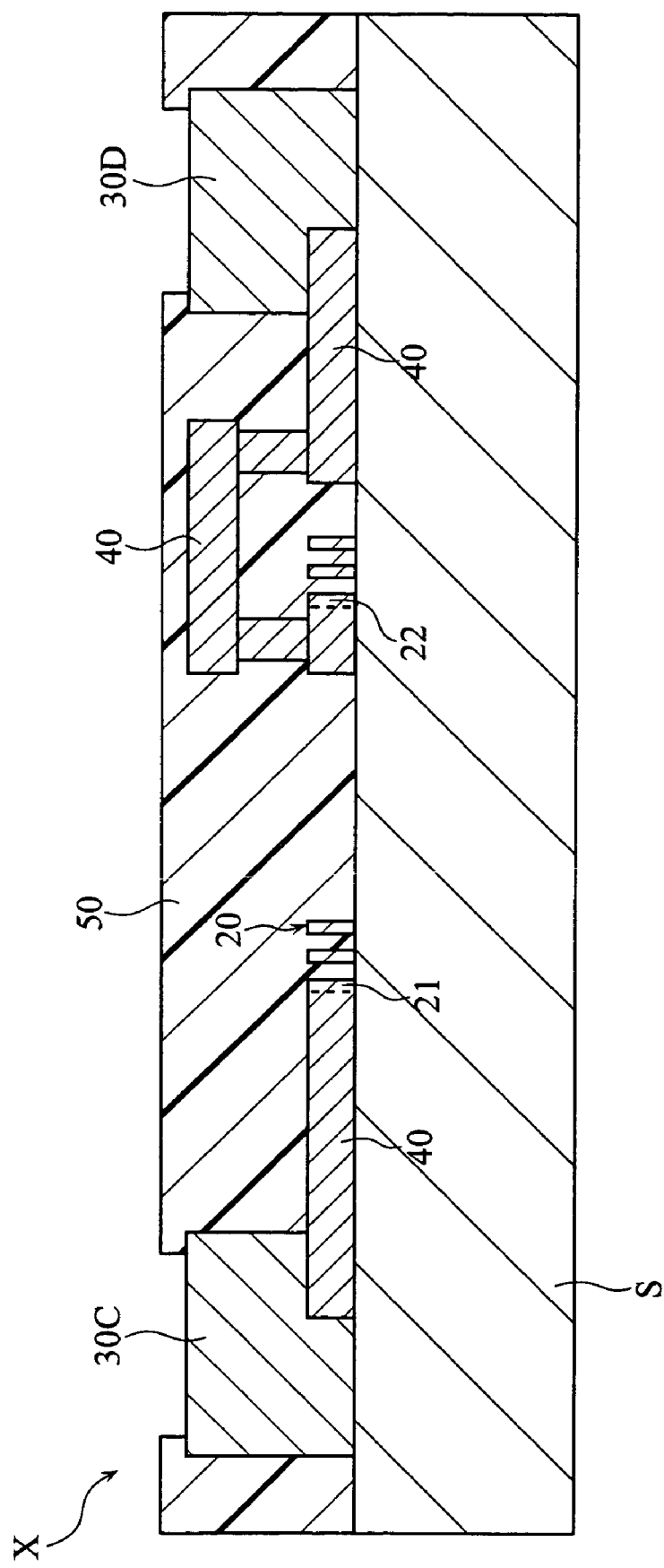
FIG. 3 is a cross-sectional view taken along the line III-III of FIG. 1.
Figure 4:
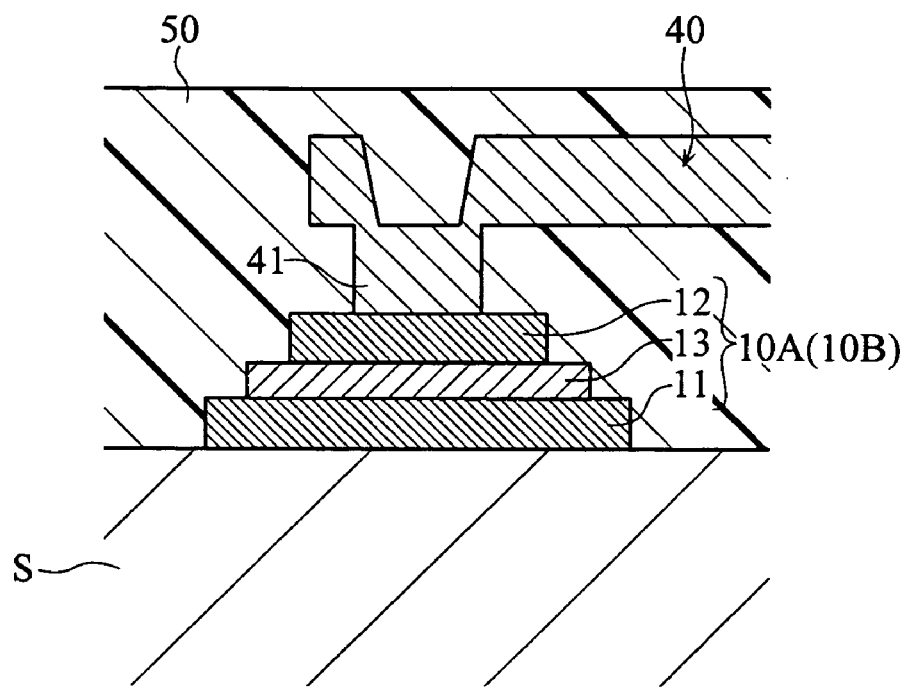
FIG. 4 is an enlarged fragmentary cross-sectional view taken along the line IV-IV of FIG. 1.

FIGS. 1 to 4 depict an integrated electronic component X according to the present invention. FIG. 1 is a plan view of the integrated electronic component X. FIGS. 2 and 3 are cross-sectional views taken along the line II-II and III-III of FIG. 1, respectively. FIG. 4 is an enlarged fragmentary cross-sectional view taken along the line IV-IV of FIG. 1.

Figure 5:
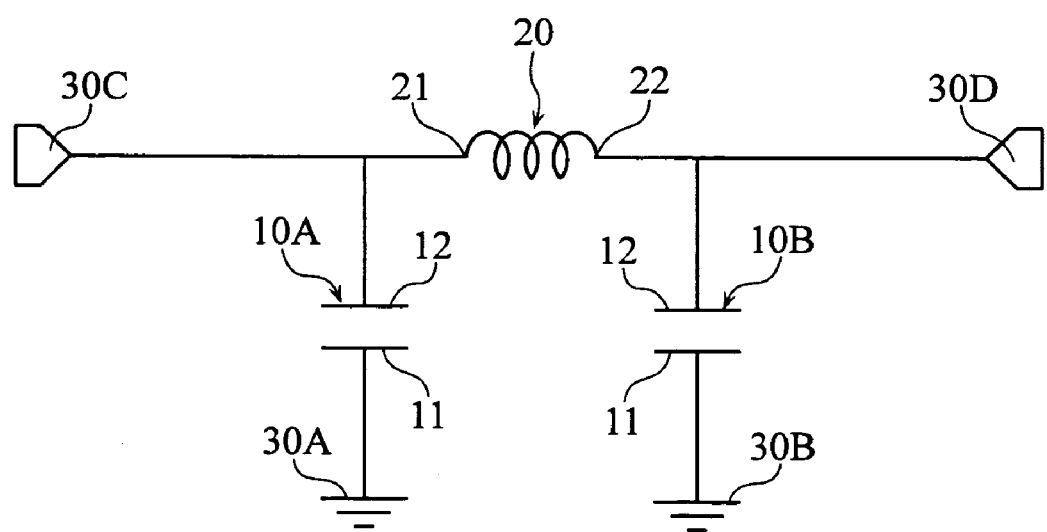
FIG. 5 is a circuit diagram of the electronic component shown in FIG. 1.

The integrated electronic component X includes a substrate S, capacitors 10A, 10B, a coil inductor 20, electrode pads 30A, 30B, 30C, 30D, a wiring 40, and a protecting film 50 (not shown in FIG. 1), and has a circuit configuration shown in FIG. 5.

The substrate S may be a semiconductor substrate, a quartz substrate, a glass substrate, a silicon on insulator (SOI) substrate, a silicon on quartz (SOQ) substrate, or a silicon on glass (SOG) substrate. The semiconductor substrate may be made of a silicon material, such as monocrystalline silicon.

The capacitors 10A, 10B respectively have a multilayer structure including electrode films 11, 12 and a dielectric film 13, as explicitly shown in FIGS. 2 and 4. The electrode film 11 is a lower electrode film formed in a pattern on the substrate S. The electrode film 11 may be made of Cu, Au, Ag or Al, and may have a multilayer structure including a plurality of conductor films. The electrode film 11 may have a thickness of 0.5 to 2 μm. The electrode film 12 is an upper electrode film formed to face the electrode film 11 via the dielectric film 13, and may be made of Cu, Au, Ag or Al. The electrode film 12 has a thickness of 2 to 4 μm. The dielectric film 13 may be made of silicon oxide, silicon nitride, aluminum oxide, tantalum oxide or titanium oxide, for example. The dielectric film 13 may have a thickness of 0.1 to 1 μm. Making the dielectric film 13 thinner facilitates granting a larger static capacitance to the capacitors 10A, 10B.

The coil inductor 20 is a flat spiral coil formed in a pattern on the substrate S as shown in FIGS. 1 and 3, and has end portions 21, 22. Preferable materials of the coil inductor 20 include Cu, Au, Ag and Al.

The electrode pads 30A to 30D serve for external connection. The electrode pads 30A, 30B serve as terminals for ground connection, while the electrode pads 30C, 30D serve as I/O terminals for electrical signals. The electrode pads 30A to 30D may be made of a Ni body with the upper surface coated with a Au film.

The wiring 40 serves to electrically connect the components on the substrate S, and includes a joint portion 41 directly connected to the electrode film 12 of the capacitor 10A, 10B as shown in FIGS. 2 and 4. Preferable materials of the wiring 40 include Cu, Au, Ag and Al. The wiring 40 and the joint portion 41 may have a thickness of 10 μm or greater. Forming the wiring 40 in a greater thickness leads to reduced resistance thereof, and the reduction in resistance is preferable from the viewpoint of reducing a signal loss in the integrated electronic component X.

Referring to FIG. 5, the capacitor 10A is electrically connected to the electrode pads 30A, 30C and the coil inductor 20. More specifically, the electrode film 11 of the capacitor 10A is electrically connected to the electrode pad 30A, and the electrode film 12 of the capacitor 10A is electrically connected to the electrode pad 30C and the end portion 21 of the coil inductor 20. Likewise, the capacitor 10B is electrically connected to the electrode pads 30B, 30D and the coil inductor 20. More specifically, the electrode film 11 of the capacitor 10B is electrically connected to the electrode pad 30B, and the electrode film 12 of the capacitor 10B is electrically connected to the electrode pad 30D and the other end portion 22 of the coil inductor 20.

The protecting film 50 may be made of a polyimide or benzocyclobutene (BCB), and covers the capacitors 10A, 10B, the coil inductor 20 and the wiring 40, leaving exposed a portion of the electrode pads 30A to 30D.

Figure 6:
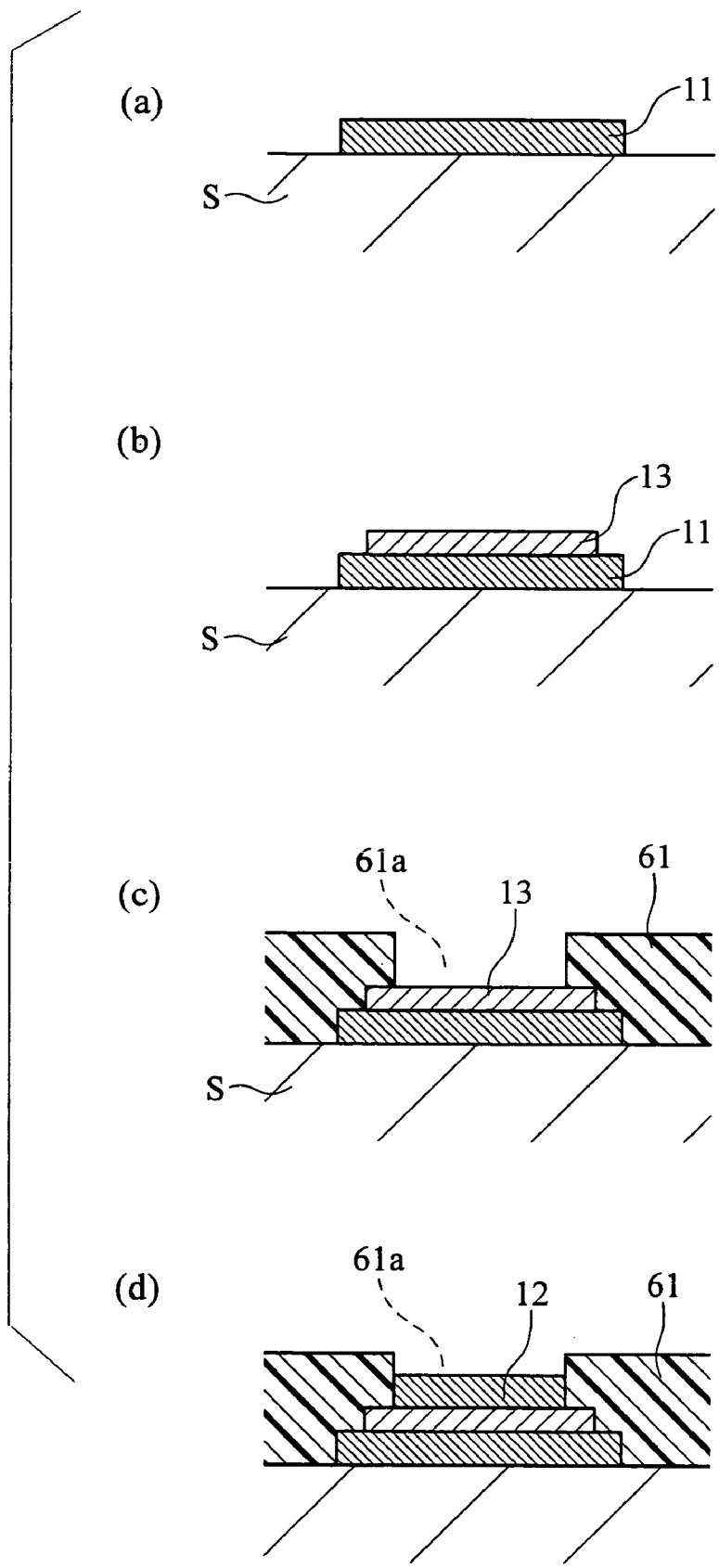
FIG. 6 shows, in section, a manufacturing process of a portion around a capacitor in the integrated electronic component shown in FIG. 1.
Figure 7:
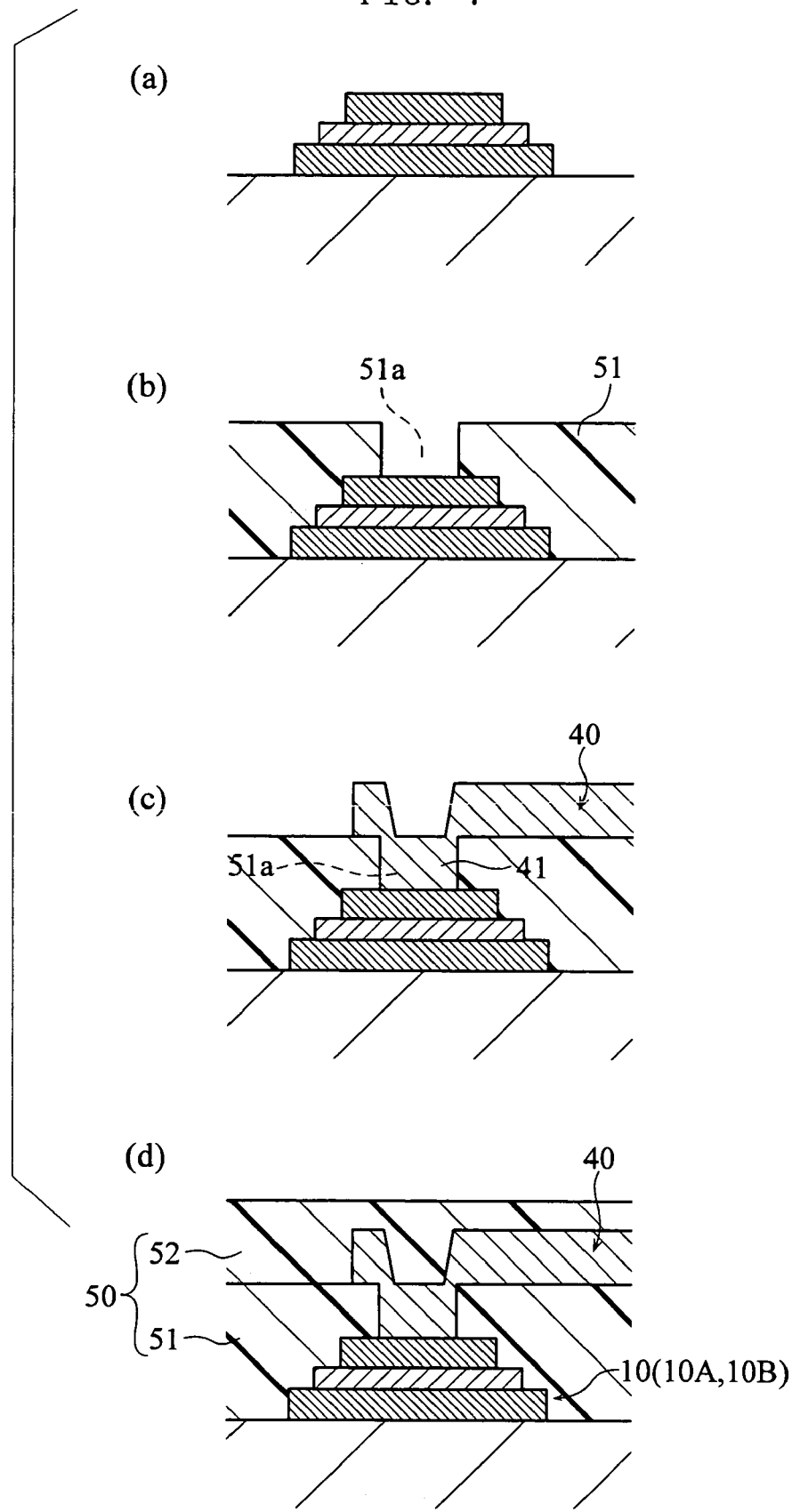
FIG. 7 shows, in section, manufacturing steps subsequent to those shown in FIG. 6.

FIGS. 6 and 7 show a manufacturing process of a portion around the capacitors 10A, 10B of the integrated electronic component X. Specifically, FIGS. 6(*a*) to 7(*d*) represent the progress of the formation process of a capacitor 10 (corresponding to either of the capacitors 10A, 10B) shown in FIG. 7(*d*), a joint portion of the wiring 40 with the capacitor 10, and the protecting film 50 around the capacitor 10, in cross-sectional drawings covering a similar section to that shown in FIG. 4.

When forming the capacitor 10, firstly the electrode film 11 is formed on the substrate S as shown in FIG. 6(*a*). A sputtering process may be performed to deposit a predetermined metal material on the substrate S, and the metal film may be subjected to a wet or dry etching process to be shaped in a predetermined pattern, for forming the electrode film 11.

Proceeding to FIG. 6(*b*), the dielectric film 13 is formed on the electrode film 11. A sputtering process may be performed to deposit a predetermined dielectric material at least on the electrode film 11, and the dielectric film may be subjected to a wet or dry etching process to be shaped in a predetermined pattern, for forming the dielectric film 13.

Then a seed layer (not shown) for electric plating is formed on the substrate S, to cover the electrode film 11 and the dielectric film 13. The seed layer may be formed by vapor deposition or sputtering.

Referring to FIG. 6(*c*), a resist pattern 61 for forming the electrode film 12 is provided. The resist pattern 61 includes an opening 61*a* defining the pattern shape of the electrode film 12. For forming the resist pattern 61, firstly a liquid photoresist is applied to the substrate S from above the electrode film 11 and the dielectric film 13, and spin coating is performed to produce a film. Then the photoresist film is subjected to exposure and subsequent development, thus to be shaped into the resist pattern 61.

The above is followed by an electric plating process to form the electrode film 12 in the opening 61*a* of the resist pattern 61, as shown in FIG. 6(*d*). In this electric plating process, the seed layer is energized. The electric plating process is appropriate for efficiently forming the electrode film 12 in a thickness of 2 to 4 μm.

Proceeding to FIG. 7(*a*), the resist pattern 61 is removed by applying a predetermined stripping solution. And the seed layer (the part at which the electrode film 12 is not formed) is removed (by a dry or wet etching process). Then as shown in FIG. 7(*b*), an insulating film 51 is formed, which is to subsequently constitute a part of the protecting film 50. The insulating film 51 includes an opening 51*a* in which a portion of the electrode film 12 is exposed.

Referring then to FIG. 7(*c*), the wiring 40 is formed. The wiring 40 includes a joint portion 41 that fills in the opening 51*a* of the insulating film 51, thus to be connected to the electrode film 12. Specific formation method of the wiring 40 includes forming a seed layer (not shown) for an electric plating process on the insulating film 51 as well as inside the opening 51*a* shown in FIG. 7(*b*), providing on the seed layer a resist pattern defining a predetermined opening for forming the wiring 40, growing a predetermined conductive material by electric plating in the opening of the resist pattern, removing the resist pattern, and removing the seed layer (the part at which the wiring 40 is not formed).

Then as shown in FIG. 7(*d*), an insulating film 52 is formed to cover the wiring 40. Thus, the capacitor 10 (10A, 10B) and the peripheral structure can be obtained, in the manufacturing process of the integrated electronic component X.

As stated earlier regarding the capacitor 92 of the conventional IPD 90, when undue stress is applied to the dielectric film between the electrode films of the capacitor element manufactured by the semiconductor processing technology, the portion of the dielectric film suffering the stress is prone to incur a flaw in the film structure, and hence prone to collapse when a high voltage is applied. Accordingly, presence of undue stress against the dielectric film impedes achieving a high withstanding voltage of the capacitor. In contrast, the capacitor 10A, 10B in the integrated electronic component X according to the present invention allows achieving a high withstanding voltage.

In the integrated electronic component X, as described above, the wiring 40 and the joint portion 41 thereof are formed to be relatively thick such as 10 μm or more, and the respective electrode films 12 of the capacitors 10A, 10B are formed in a thickness of 2 to 4 μm. Although stress strain tends to concentrate on the periphery of the joint portion 41, which is relatively thick, the propagation of the stress strain to the dielectric film 13 can be significantly suppressed, because the electrode film 12 has a thickness of 2 μm or more. Such structure, therefore, can prevent emergence of a flow in the film structure of the dielectric film 13 originating from the propagation of the stress strain from the joint portion 41 to the dielectric film 13. Further, the electrode film 12 itself, which has a thickness of 4 μm or less, does not incur therein unduly great stress strain, and hence barely provokes emergence of a flaw due to the stress strain, in the film structure of the dielectric film 13. For such reasons, the capacitor 10A, 10B allows achieving a high withstanding voltage.

The inventors produced several capacitor elements and measured their withstanding voltages for comparison. The results are as follows.

WORKING EXAMPLE 1

A capacitor element was fabricated to have the structural features of the capacitor 10A and its neighborhood shown in FIG. 4. Specifically, the substrate S was made of quartz. The electrode film 11 had a multilayer structure consisting of a Ti film (50 nm thick) provided on the substrate S, an Au film (500 nm thick) on the Ti film, an Ni film (50 nm thick) on the Au film, and another Au film (500 nm thick) on the Ni film. The electrode film 12 was an electrically plated Cu film (2 µm thick). The dielectric film 13 was an SiO$_2$ film (220 nm thick). The wiring 40, including the joint portion 41, had a multilayer structure consisting of an electrically plated Ni film (10 µm thick) closer to the capacitor 10, and an electrically plated Ai film (2 µm thick) formed on the Ni film.

WORKING EXAMPLE 2

A capacitor element of Working Example 2 was fabricated to have a structure identical to that of the above capacitor element (Working Example 1), except that the Cu-plated electrode film 12 had a thickness of 4 µm instead of 2 µm.

COMPARATIVE EXAMPLES 1, 2

Capacitor elements were fabricated to have a structure identical to that of the capacitor element of Working Example 1, except that the upper electrode film (corresponding to the Cu-plated electrode film 12) had a thickness of 1 µm (Comparative Example 1) instead of 2 µm, or a thickness of 10 µm (Comparative Example 2).

<Measurement of Withstanding Voltage>

Figure 8:
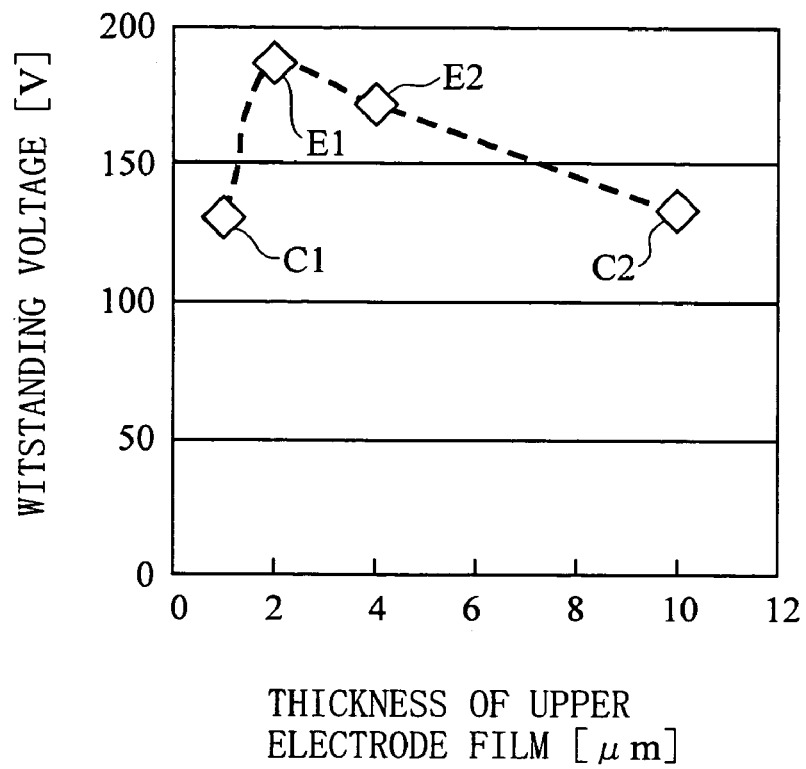
FIG. 8 is a graph showing measurement results of withstanding voltages with respect to preferred examples 1, 2 and comparative examples 1, 2.
Figure 9:
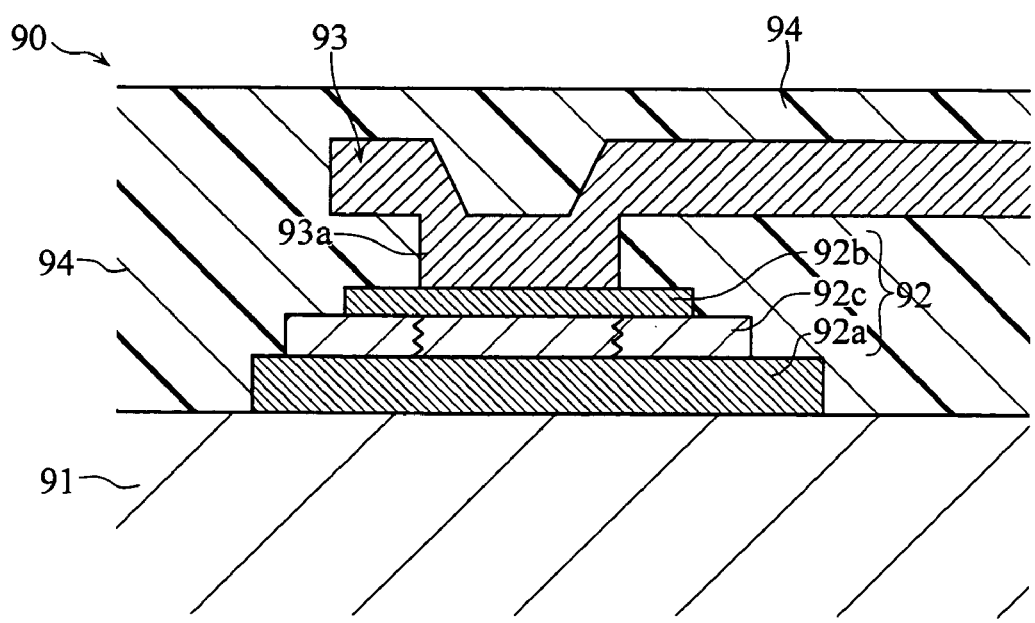
FIG. 9 is a schematic cross-sectional view showing a part of a conventional IPD.

The withstanding voltage was measured with respect to the capacitor elements according to Working Examples 1, 2 and Comparative Examples 1, 2. The withstanding voltages of the capacitor elements according to Working Examples 1, 2 were 185 V and 172 V, respectively. The withstanding voltages of the capacitor elements according to Comparative Examples 1, 2 were 130 V and 133 V, respectively. These results are shown in the graph of FIG. 8, in which the horizontal axis represents the thickness [µm] of the electrode film 12 (upper electrode film), and the vertical axis represents the withstanding voltage [V]. The measurement results with respect to the capacitor elements according to Working Examples 1, 2 and Comparative Examples 1, 2 are plotted at points indicated by E1, E2, C1 and C2, respectively.

<Evaluation>

As seen from FIG. 8, the withstanding voltages of the capacitor elements according to Comparative Examples 1, 2 did not exceed 135 V. The examining of the dielectric film 13 of the capacitor element according to Comparative Example 1 after the dielectric breakdown in the withstanding voltage measurement showed that the collapse of the film structure was observed mainly in a portion of the dielectric film 13 corresponding to the periphery of the joint portion 41 of the wiring 40. In the capacitor element of Comparative Example 1 prior to the occurrence of a dielectric breakdown, stress strain tends to concentrate on a periphery of the joint portion 41, which is relatively thick, and the strain propagates to the dielectric film 13 via the upper electrode film, which is as thin as 1 µm. As a result, the film structure in the portion of the dielectric film 13 corresponding to the periphery of the joint portion 41 suffers more flaws than in the other portions of the dielectric film 13. Thus, the dielectric film 13 is prone to incur the collapse of the film structure in the portion corresponding to the periphery of the joint portion 41. By examining the dielectric film 13 of the capacitor element according to Comparative Example 2 after the dielectric breakdown in the withstanding voltage measurement, it was found that the collapse of the film structure occurred in a portion of the dielectric film 13 corresponding to the periphery of the upper electrode film. Since stress strain concentrates in the periphery of the upper electrode film of Comparative Example 2, which is relatively thick, the stress strain propagates to the dielectric film 13 in the capacitor element according to the comparative example 2 before the dielectric breakdown occurred. Thus, more flaws were produced in the film structure in the portion of the dielectric film 13 corresponding to the periphery of the upper electrode film, than in the other portions. Accordingly, in the capacitor element according to Comparative Example 2, the dielectric film 13 is prone to incur the collapse of the film structure in the portion corresponding to the periphery of the upper electrode film.

On the other hand, the withstanding voltages of the capacitor elements according to Working Examples 1, 2 exceeded 170 V and were greater by more than 35 V than those of the capacitor elements according to Comparative Examples 1, 2. This is probably because the 2 µm-thick electrode film 12 of Working Example 1 and the 4 µm-thick electrode film 12 of Working Example 2 can suppress the propagation of stress strain from the joint portion 41 to the dielectric film 13 more effectively than the upper electrode film in Comparative Example 1, thereby suppressing emergence of flaws in the film structure of the dielectric film 13. Also, the electrode films 12 of Working Examples 1, 2 merely incur smaller stress strain than the upper electrode film according to Comparative Example 2, which is advantageous to the suppression of the flaws in the dielectric film 13.

The invention claimed is:

1. An electronic component comprising:
a substrate;
a capacitor having a multilayer structure including a first electrode film provided on the substrate,
a second electrode film having a thickness of 2 to 4 µm and facing the first electrode film, and a dielectric film interposed between the first and the second electrode films;
a wiring including a joint portion connected to the second electrode film and located opposite to the dielectric film;
an electrode pad provided on the substrate and electrically connected to the capacitor; and
a protecting film formed on the substrate for covering at least the capacitor and the wiring;
wherein the electrode pad is higher than the second electrode film of the capacitor and lower than a top surface of the protecting film.

2. The electronic component according to claim 1, wherein the joint portion is thicker than the second electrode film.

3. The electronic component according to claim 2, wherein the joint portion has a thickness of no smaller than 10 µm.

4. The electronic component according to claim 1, wherein the dielectric film has a thickness of no greater than 1 µm.

5. The electronic component according to claim 1, wherein the second electrode film is produced by plating.

6. The electronic component according to claim 1, further comprising a passive component provided on the substrate, wherein the wiring electrically connects the passive component and the second electrode film of the capacitor to each other.

* * * * *